(12) United States Patent
Kim

(10) Patent No.: US 11,296,697 B1
(45) Date of Patent: Apr. 5, 2022

(54) ON-DIE TERMINATION CIRCUIT, OPERATING METHOD THEREOF, AND SEMICONDUCTOR SYSTEM

(71) Applicant: SK hynix Inc., Icheon-si (KR)

(72) Inventor: Bo Ram Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/187,418

(22) Filed: Feb. 26, 2021

(30) Foreign Application Priority Data

Nov. 16, 2020 (KR) ........................ 10-2020-0152854

(51) Int. Cl.
*H03K 19/00* (2006.01)
(52) U.S. Cl.
CPC ................................ *H03K 19/0005* (2013.01)
(58) Field of Classification Search
CPC .................................................. H03K 19/0005
USPC ............................................................ 326/30
See application file for complete search history.

(56) References Cited

U.S. PATENT DOCUMENTS

| | | | |
|---|---|---|---|
| 7,755,366 B2 * | 7/2010 | Hosoe | H03K 19/00384 324/601 |
| 7,906,986 B2 | 3/2011 | Lee | |
| 10,529,390 B1 * | 1/2020 | Satoh | G06F 3/0632 |
| 2015/0115999 A1 * | 4/2015 | Lee | G11C 5/04 326/30 |
| 2015/0117122 A1 * | 4/2015 | Lee | G11C 7/1057 365/189.11 |
| 2017/0099050 A1 * | 4/2017 | Lee | H03K 19/0005 |
| 2017/0168746 A1 * | 6/2017 | Kwon | G06F 3/0629 |
| 2020/0058332 A1 * | 2/2020 | Choi | G11C 11/4082 |
| 2020/0293199 A1 * | 9/2020 | Choi | G06F 3/0658 |
| 2021/0141747 A1 * | 5/2021 | Jeong | G06F 13/1673 |

FOREIGN PATENT DOCUMENTS

| | | |
|---|---|---|
| KR | 102070619 B1 | 1/2020 |
| KR | 1020200020069 A | 2/2020 |

OTHER PUBLICATIONS

Dong Uk Lee et al., Multi-Slew-Rate Output Driver and Optimized Impedance-Calibration Circuit for 66nm 3.0Gb/s/pin DRAM Interface, ISSCC 2008 / SESSION 14 / EMBEDDED & GRAPHICS DRAMs /14.6, 2008, p. 280-p. 281 & p. 613, IEEE International Solid-State Circuits Conference.

* cited by examiner

*Primary Examiner* — Don P Le
(74) *Attorney, Agent, or Firm* — William Park & Associates Ltd.

(57) ABSTRACT

An on-die termination circuit may include a resistance combination circuit, a first calibration circuit, a second calibration circuit, and a termination circuit. The resistance combination circuit may have an additional resistance value for setting a combined resistance value by combining the additional resistance value with a reference resistance value, and may be configured to set the additional resistance value based on a second calibration code. The first calibration circuit may be configured to generate a first calibration code corresponding to the reference resistance value or the combined resistance value according to a calibration sequence. The second calibration circuit may be configured to generate the second calibration code corresponding to the first calibration code. The termination circuit may be coupled to an input/output pad, and may be configured to set a termination resistance value corresponding to the first and second calibration codes.

20 Claims, 5 Drawing Sheets

ON-DIE TERMINATION CIRCUIT, OPERATING METHOD THEREOF, AND SEMICONDUCTOR SYSTEM

CROSS-REFERENCES TO RELATED APPLICATION

The present application claims priority under 35 U.S.C. § 119(a) to Korean application number 10-2020-0152854, filed on Nov. 16, 2020, in the Korean Intellectual Property Office, which is incorporated herein by reference in its entirety.

BACKGROUND

1. Technical Field

Various embodiments generally relate to an on-die termination circuit, an operating method thereof and a semiconductor system, and more particularly, to an on-die termination circuit capable of implementing various termination resistance values, an operating method thereof, and a semiconductor system.

2. Related Art

An integrated circuit including a semiconductor device and a semiconductor memory device receives various signals, performs a preset operation, and outputs a result value of the operation. In this case, a signal inputted to the integrated circuit and a signal outputted from the integrated circuit may be distorted due to various factors. One of the reasons why the signal distortion occurs is a mismatch in impedance between a transmitter side that transmits a signal and a receiver side that receives a signal. Therefore, the integrated circuit requires an on-die termination circuit for an impedance matching operation. The impedance matching operation utilizes an operation of adjusting a terminal resistance value reflected into a transmission line through which a signal is transferred.

SUMMARY

Various embodiments are directed to an on-die termination circuit capable of implementing various termination resistance values, an operating method thereof, and a semiconductor system.

In an embodiment, an on-die termination circuit may include a resistance combination circuit, a first calibration circuit, a second calibration circuit, and a termination circuit. The resistance combination circuit may have an additional resistance value for setting a combined resistance value by combining the additional resistance value with a reference resistance value, and may be configured to set the additional resistance value based on a second calibration code. The first calibration circuit may be configured to generate a first calibration code corresponding to the reference resistance value or the combined resistance value according to a calibration sequence. The second calibration circuit may be configured to generate the second calibration code corresponding to the first calibration code. The termination circuit may be coupled to an input/output pad, and may be configured to set a termination resistance value corresponding to the first and second calibration codes.

In an embodiment, an operating method of an on-die termination circuit may include a first calibration operation step, a second calibration operation step, a combined resistance value setting step, and a third calibration operation step. The first calibration operation step may generate a first calibration code through a calibration operation based on a reference resistance value. The second calibration operation step may generate a second calibration code through a calibration operation based on the first calibration code. The combined resistance value setting step may set a combined resistance value by combining an additional resistance value with the reference resistance value. The third calibration operation step may generate a third calibration code through a calibration operation based on the combined resistance value. The termination resistance value setting step may set a termination resistance value based on the second calibration code generated in the second calibration operation step and the third calibration code generated in the third calibration operation step.

In an embodiment, a semiconductor system may include a host circuit and an integrated circuit. The host circuit may be configured to transmit/receive data and provide target resistance value information. The integrated circuit may include an on-die termination circuit that has an additional resistance value for setting a combined resistance value by combining the additional resistance value with a reference resistance value. The integrated circuit may be configured to reflect a termination resistance value, set according to a calibration sequence, into an input/output pad, wherein the additional resistance value is adjusted based on the target resistance value information.

DETAILED DESCRIPTION

The description of the present disclosure discloses an embodiment of a structural and/or functional configuration of an on-die circuit for adjusting termination resistance values in a termination circuit. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe the order of the steps. The steps may be performed in an order different from the order described in the context unless a specific order is clearly described in the context. That is, the steps may be performed according to a described order, may be performed substantially at the same time as the described order, or may be performed in a reverse order of the described order.

Unless otherwise defined, all the terms used herein, including technological or scientific terms, have the same meanings as those that are typically understood by those skilled in the art. Terms defined in commonly used dictionaries should be construed as having the same meanings as those in the context in related technology and should not be construed as having ideal or excessively formal meanings, unless clearly defined in the application.

Figure 1:
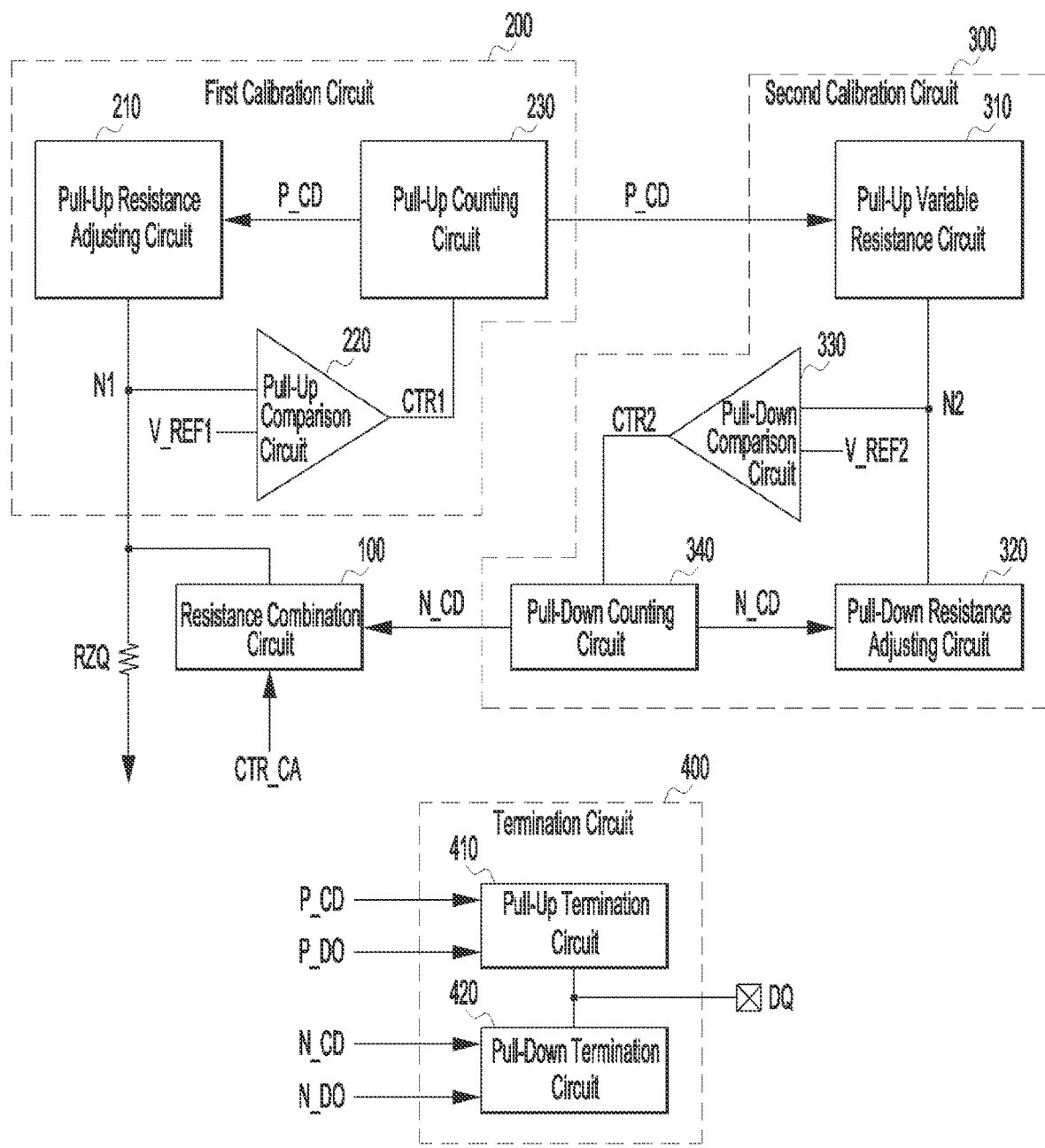
FIG. 1 is a block diagram illustrating a configuration of an on-die termination circuit in accordance with an embodiment.

FIG. 1 is a block diagram illustrating a configuration of an on-die termination circuit in accordance with an embodiment.

Referring to FIG. 1, the on-die termination circuit may include a resistance combination circuit 100, a first calibration circuit s 200, a second calibration circuit 300 and a termination circuit 400.

By combining the additional resistance value with a reference resistance value, the resistance combination circuit 100 may be configured to have an additional resistance value for setting a combined resistance value. Based on a second calibration code N_CD which will be described below, the resistance combination circuit 100 may include a resistance circuit for setting the additional resistance circuit. The resistance combination circuit 100 may be coupled in parallel to a reference resistor RZQ. The reference resistor RZQ may be implemented as a passive element or the like, which is not affected by a PVT (Process, Voltage, Temperature) variation. Therefore, the reference resistor RZQ may have a preset reference resistance value.

Then, based on a calibration sequence, whether to enable the resistance combination circuit 100 may be decided. Then, based on a calibration control signal CTR_CA corresponding to the calibration sequence, the resistance combination circuit 100 may be operated. That is, the resistance combination circuit 100 may be enabled or disabled based on the calibration control signal CTR_CA. Thus, based on a calibration control signal CTR_CA corresponding to the calibration sequence, the resistance combination circuit 100 may or may not reflect an additional resistance value into a first node N1, When the additional resistance value is reflected into the first node N1, a combined resistance value corresponding to the reference resistance value and the additional resistance value may be reflected into the first node N1. Furthermore, when the additional resistance value is not reflected into the first node N1, only the reference resistance value may be reflected into the first node N1. The calibration sequence and the calibration control signal CTR_CA will be described below again.

A first calibration code P_CD corresponding to the reference resistance value or the combined resistance value according to the calibration sequence may be generated by the first calibration circuit 200. The calibration sequence may include first to third calibration operations which will be described below again. The first calibration circuit 200 will be described in more detail as follows. The first calibration circuit 200 may include a pull-up resistance adjusting circuit 210, a pull-up comparison circuit 220 and a pull-up counting circuit 230.

Based on the first calibration code P_CD, the pull-up resistance adjusting circuit 210 may be configured to adjust an internal resistance value. The pull-up resistance adjusting circuit 210 may include an internal resistor. The internal resistor may have an internal resistance value which is set at an initial stage. Based on the first calibration code P_CD, the internal resistance value may be adjusted.

By comparing a voltage corresponding to the internal resistance value, the reference resistance value and the additional resistance value, to a pull-up reference voltage V_REF1, the pull-up comparison circuit 220 may be configured to generate a pull-up counting control signal CTR1 by comparing a voltage, corresponding to the internal resistance value, the reference resistance value and the additional resistance value, to a pull-up reference voltage V_REF1. The voltage corresponding to the internal resistance value, the reference resistance value and the additional resistance value may indicate a voltage formed in the first node N1. Thus, the first node N1 may have a voltage into which the internal resistance value and the reference resistance value or the combined resistance value are reflected according to a calibration operation.

The pull-up counting circuit 230 may be configured to generate the first calibration code P_CD which is counted based on the pull-up counting control signal CTR1. The first calibration code P_CD may be increased or decreased based on the pull-up counting control signal CTR1.

Based on the reference resistance value or the combined resistance value and the internal resistance value reflected into the first node N1, through the above-described configuration, the first calibration circuit 200 may generate the first calibration code P_CD.

The second calibration circuit 300 may be configured to generate a second calibration code N_CD corresponding to the first calibration code P_CD. The second calibration circuit 300 will be described in more detail as follow. The second calibration circuit 300 may include a pull-up variable resistance circuit 310, a pull-down resistance adjusting circuit 320, a pull-down comparison circuit 330, and a pull-down counting circuit 340.

Based on the first calibration code P_CD, the pull-up variable resistance circuit 310 may be configured to set a pull-up internal resistance value. The pull-up variable resistance circuit 310 may include a pull-up internal resistor. The pull-up internal resistor may have a pull-up internal resistance value which is set at the initial stage. Based on the first calibration code P_CD, the pull-up internal resistance value may be adjusted.

Based on the second calibration code N_CD, the pull-down resistance adjusting circuit 320 may be configured to adjust a pull-down internal resistance value. The pull-down resistance adjusting circuit 320 may include a pull-down internal resistor. The pull-down internal resistor may have a pull-down internal resistance value which is set at the initial stage. Based on the second calibration code N_CD, the pull-down internal resistance value may be adjusted.

By comparing a voltage corresponding to the pull-up internal resistance value and the pull-down internal resistance value, to a pull-down reference voltage V_REF2, the pull-down comparison circuit 330 may be configured to generate a pull-down counting control signal CTR2. The voltage corresponding to the pull-up internal resistance value and the pull-down internal resistance value may indicate a voltage formed in a second node N2.

The pull-down counting circuit 340 may be configured to generate the second calibration code N_CD which is counted based on the pull-down counting control signal CTR2. Based on the pull-down counting control signal CTR2, the second calibration code N_CD may be increased or decreased.

Through the above-described configuration, based on the pull-up internal resistance value set by the pull-up variable resistance circuit 310 and the pull-down internal resistance value set by the pull-down resistance adjusting circuit 320, the second calibration circuit 300 may generate the second calibration code N_CD.

The termination circuit 400 may be configured to set a termination resistance value corresponding to the first and second calibration codes P_CD and N_CD. The termination circuit 400 may be coupled to an input/output pad DQ, and include a pull-up termination circuit 410 and a pull-down termination circuit 420.

Based on the first calibration code P_CD, the pull-up termination circuit 410 may be configured to set a pull-up termination resistance value of the input/output pad DQ. Based on the second calibration code N_CD, the pull-down termination circuit 420 may be configured to set a pull-down termination resistance value of the input/output pad DQ. After the pull up termination resistance value is set, the pull-up termination circuit 410 may receive pull-up data P_DO and output the received data to the input/output pad DQ. After the pull-down termination resistance value is set, the pull-down termination circuit 420 may receive pull-down data N_DO and output the received data to the input/output pad DQ.

Based on the first and second calibration codes P_CD and N_CD, through the above-described configuration, the termination circuit 400 may set pull-up and pull-down termination resistance values for the input/output pad DQ.

In accordance with the embodiment, the on-die termination circuit may include the resistance combination circuit 100. By using the additional resistance value set by the resistance combination circuit 100 according to the calibration sequence, the on-die termination circuit may set various termination resistance values.

Figure 2:
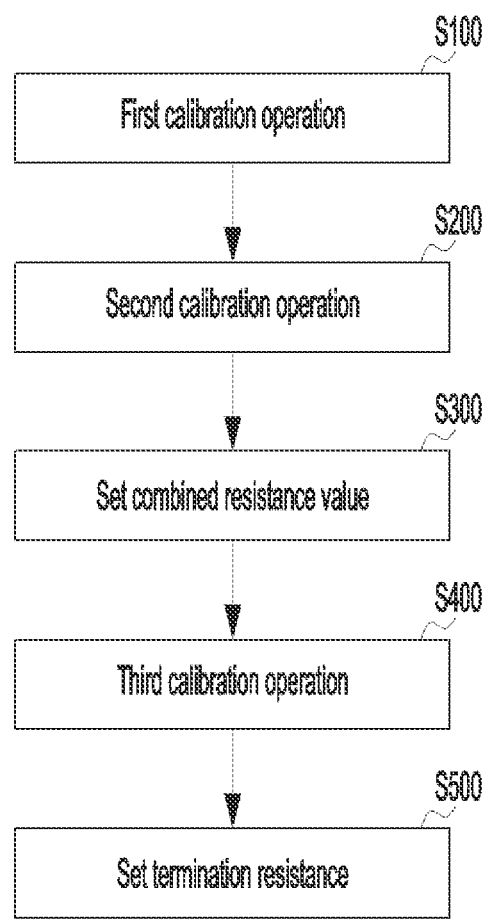
FIG. 2 is a flowchart illustrating an operating method of the on-die termination circuit of FIG. 1.

FIG. 2 is a flowchart illustrating an operating method of the on-die termination circuit of FIG. 1.

Referring to FIG. 2, the operating method of the on-die termination circuit may include a first calibration operation step S100, a second calibration operation step S200, a combined resistance value setting step S300, a third calibration operation step S400 and a termination resistance setting step S500.

Hereafter, the operating method of the on-die termination circuit will be described with reference to FIGS. 1 and 2.

Based on the reference resistance value, the first calibration operation step S100 may include generating the first calibration code P_CD through a calibration operation. The first calibration operation step S100 includes the circuit operations of the pull-up resistance adjusting circuit 210, the pull-up comparison circuit 220 and the pull-up counting circuit 230 in FIG. 1.

Hereafter, the first calibration operation step S100 will be described.

By comparing the voltage of the first node N1 and the preset pull-up reference voltage V_REF1, the pull-up comparison circuit 220 may generate the pull-up counting control signal CTR1. At this time, the resistance combination circuit 100 may be disabled based on the calibration control signal CTR_CA. Therefore, the voltage of the first node N1 may be set by the internal resistance value of the pull-up resistance adjusting circuit 210 and the reference resistance value of the reference resistor RZQ. Then, based on the pull-up counting control signal CTR1, the pull-up counting circuit 230 may generate the first calibration code P_CD which is counted. Then, based on the first calibration code P_CD, the pull-up resistance adjusting circuit 210 may adjust an internal resistance value.

The above-described series of operations in the first calibration operation step S100 may be performed until the voltage of the first node N1 and the pull-up reference voltage V_REF1 become equal to each other. Through the first calibration operation step S100, the first calibration code P_CD may be generated.

Based on the first calibration code P_CD, the second calibration operation step S200 may include generating the second calibration code N_CD through a calibration operation. The second calibration operation step S200 may include the circuit operations of the pull-up variable resistance circuit 310, the pull-down resistance adjusting circuit 320, the pull-down comparison circuit 330 and the pull-down counting circuit 340 in FIG. 1.

Hereafter, the second calibration operation step S200 will be described.

Based on the first calibration code P_CD, the pull-up variable resistance circuit 310 may set a pull-up internal resistance value. Then, by comparing the voltage of the second node N2 and the preset pull-down reference voltage V_REF2, the pull-down comparison circuit 330 may generate the pull-down counting control signal CTR2. The voltage of the second node N2 may be set by the pull-up internal resistance value of the pull-up variable resistance circuit 310 and the pull-down internal resistance value of the pull-down resistance adjusting circuit 320. Then, based on the pull-down counting control signal CTR2, the pull-down counting circuit 340 may generate the second calibration code N_CD which is counted. Then, based on the second calibration code N_CD, the pull-down resistance adjusting circuit 320 may adjust a pull-down internal resistance value.

The above-described series of operations in the second calibration operation step S200 may be performed until the voltage of the second node N2 and the pull-down reference voltage V_REF2 become equal to each other. Through the second calibration operation step S200, the second calibration code N_CD may be generated. The second calibration code N_CD generated at this time may be transferred to the pull-down termination circuit 420 of FIG. 1.

Then, the combined resistance value setting step S300 may include setting a combined resistance value by combining an additional resistance value with the reference resistance value. As described above, based on the calibration control signal CTR_CA and the second calibration code N_CD, the resistance combination circuit 100 of FIG. 1 may set the additional resistance value. That is, after the second calibration operation step S200, the calibration control signal CTR_CA may be activated for the third calibration operation step S400. When the resistance combination circuit 100 is enabled, the reference resistance value of the reference resistor RZQ and the additional resistance value of the resistance combination circuit 100 may be combined to set the combined resistance value. Therefore, the voltage of the first node N1 may be set by the internal resistance value of the pull-up resistance adjusting circuit 210 and the combined resistance value.

The third calibration operation step S400 may include generating the first calibration code P_CD through a calibration operation based on the combined resistance value. Since the third calibration operation step S400 is similar to the first calibration operation step S100, the detailed descriptions thereof will be omitted herein. However, the first calibration operation step S100 may include generating the first calibration code P_CD by reflecting the reference resistance value of the reference resistor RQZ. Furthermore, the third calibration operation step S400 may include generating the first calibration code P_CD by reflecting the combined resistance value corresponding to the reference resistance value of the reference resistor RQZ and the additional resistance value of the resistance combination circuit 100. The first calibration code P_CD generated at this time may be transferred to the pull-up termination circuit 410 of FIG. 1.

Based on the second calibration code N_CD generated in the second calibration operation step S200 and the first calibration code P_CD generated in the third calibration operation step S400, the termination resistance setting step S500 may include setting a termination resistance value. For reference, the first calibration code P_CD generated in the first calibration operation step S100 and the first calibration code P_CD generated in the third calibration operation step S400 may be different from each other. Then, based on the first calibration code P_CD generated in the third calibration operation step S400, the pull-up termination circuit 410 of FIG. 1 may set the pull-up termination resistance value of the input/output pad DQ. Based on the second calibration code N_CD generated in the second calibration operation step S200, the pull-down termination circuit 420 may set the pull-down termination resistance value of the input/output pad DQ.

Based on the calibration sequence, the on-die termination circuit in accordance with the embodiment may generate the first and second calibration codes P_CD and N_CD through the first to third calibration operations. Then, the on-die termination circuit may set more various termination resistance values through the first and second calibration codes P_CD and N_CD.

Referring back to FIG. 1, the resistance combination circuit 100 may have an additional resistance value. The on-die termination circuit in accordance with the embodiment may have various additional resistance values depending on the system environment. Hereafter, a configuration for setting the additional resistance value in more various manners will be described with reference to FIG. 3.

Figure 3:
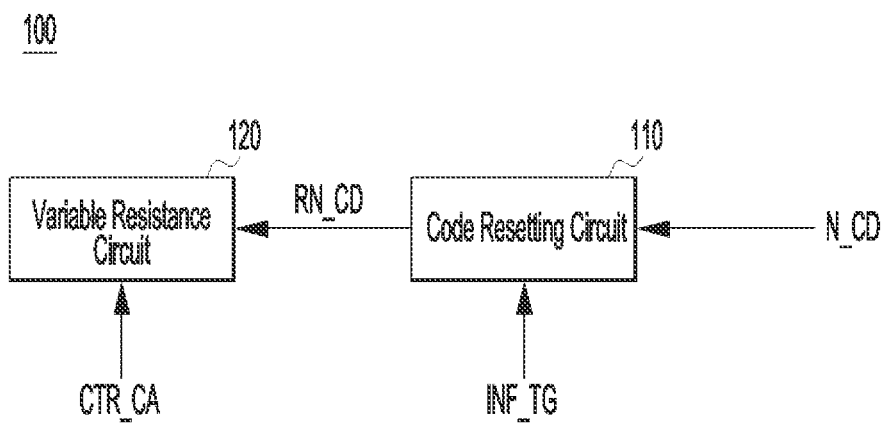
FIG. 3 is a block diagram illustrating a configuration of a resistance combination circuit of FIG. 1.

FIG. 3 is a block diagram illustrating a configuration of the resistance combination circuit 100 of FIG. 1.

Referring to FIG. 3, the resistance combination circuit 100 may include a code resetting circuit 110 and a variable resistance circuit 120.

Based on target resistance value information INF_TG, the code resetting circuit 110 may be configured to reset the second calibration code N_CD. The target resistance value information INF_TG may be information corresponding to a target resistance value for the additional resistance value formed in the resistance combination circuit 100. The target resistance value information INF_TG may be provided by a mode resister set. Although the target resistance value information INF_TG will be described below again, the target resistance value information INF_TG may be provided by a host device which transmits/receives data to/from an integrated circuit including the on-die termination circuit.

The code resetting circuit 110 may generate an output code RN_CD through a shifting operation on the second calibration code N_CD based on the target resistance value information INF_TG. At this time, the output code RN_CD may have a multiple relationship with the second calibration code N_CD. Based on the target resistance value information INF_TG, the code resetting circuit 110 may adjust an offset of the second calibration code N_CD. When the offset may be adjusted, it may indicate that the second calibration code N_CD may be adjusted in a positive (+) or negative (−) direction within a predetermined offset range. The code resetting circuit 110 may generate the output code RN_CD by performing one or more operations of the shifting operation and the offset adjusting operation.

Based on the output code RN_CD of the code resetting circuit 110, then, the variable resistance circuit 120 may be configured to set the additional resistance value.

As described above, based on the target resistance value information INF_TG, the code resetting circuit 110 may reset the second calibration code N_CD. Therefore, the variable resistance circuit 120 may reset the additional resistance value based on the target resistance value information INF_TG.

The on-die termination circuit in accordance with the embodiment may diversify the additional resistance value according to the target resistance value information INF_TG. When the additional resistance value may be diversified, it may indicate that the combined resistance value may be diversified.

Referring back to FIG. 1, the pull-up termination circuit 410 of the termination circuit 400 may have a pull-up termination resistance value, and the pull-down termination circuit 420 of the termination circuit 400 may have a pull-down termination resistance value. The on-die termination circuit in accordance with the embodiment may have various pull-up termination resistance values and pull-down termination resistance values depending on the system environment. Hereafter, a configuration for setting the pull-up termination resistance value in more various manners will be described with reference to FIG. 4. Since the pull-up termination circuit 410 and the pull-down termination circuit 420 are configured in a similar manner to each other, the pull-up termination circuit 410 will be taken as an example for description.

Figure 4:
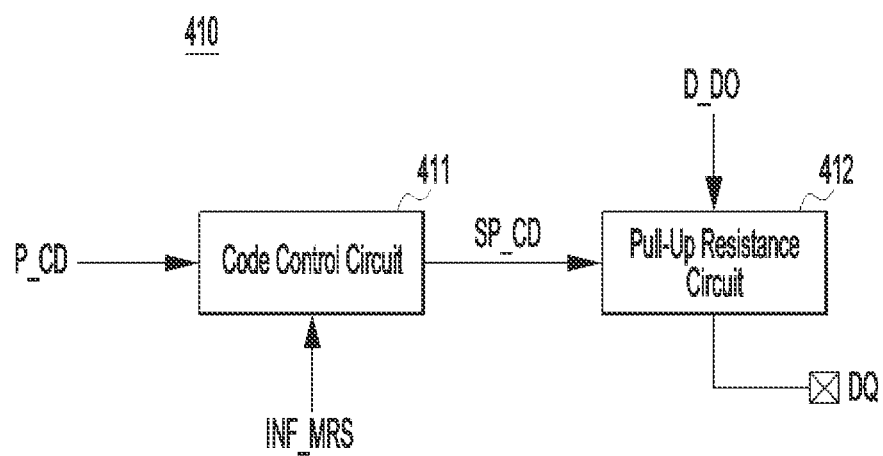
FIG. 4 is a block diagram illustrating a configuration of a pull-up termination circuit of FIG. 1.

FIG. 4 is a block diagram illustrating a configuration of the pull-up termination circuit 410 of FIG. 1.

Referring to FIG. 4, the pull-up termination circuit 410 may include a code control circuit 411 and a pull-up resistance circuit 412.

Based on resistance setting information INF_MRS, the code control circuit 411 may be configured to reset the first calibration code P_CD. The resistance setting information INF_MRS may be information corresponding to a target resistance value for a pull-up termination resistance value. The resistance setting information INF_MRS may be provided by the mode resister set.

Based on the resistance setting information INF_MRS, the code control circuit 411 may generate an output code SP_CD through a shifting operation on the first calibration code P_CD. At this time, the output code SP_CD may have a multiple relationship with the first calibration code P_CD.

Based on the resistance setting information INF_MRS, the code control circuit 411 may adjust an offset of the first calibration code P_CD. The code control circuit 411 may generate the output code SP_CD by performing one or more operations of the shifting operation and the offset adjusting operation.

Based on the output code SP_CD of the code control circuit 411, the pull-up resistance circuit 412 may be configured to reset the pull-up termination resistance value.

As described above, based on the resistance setting information INF_MRS, the code control circuit 411 may reset the first calibration code P_CD. Therefore, the pull-up resistance circuit 412 may reset the pull-up termination resistance value based on the resistance setting information INF_MRS.

The on-die termination circuit in accordance with the embodiment may diversify the pull-up and pull-down termination resistance values according to the resistance setting information INF_MRS.

Hereafter, the operation of the on-die termination circuit in accordance with the embodiment will be described with reference to FIGS. 1 to 4.

First, when the reference resistance value of the reference resistor RZQ is 120 ohm, during the first calibration operation, the resistance combination circuit 100 of FIG. 1 may be disabled. Therefore, through the first calibration operation, the internal resistance value of the pull-up resistance adjusting circuit 210 may be set to 120 ohm. Then, based on the first calibration code P_CD, during the second calibration operation, the pull-up internal resistance value of the pull-up variable resistance circuit 310 may be set to 120 ohm. Therefore, through the second calibration operation, the pull-down internal resistance value of the pull-down resistance adjusting circuit 320 may be set to 120 ohm.

The second calibration code N_CD generated through the second calibration operation may be provided to the pull-down termination circuit 420. At this time, as described with reference to FIG. 4, the second calibration code N_CD may be reset based on the resistance setting information INF_MRS. For example, through a shifting operation, the second calibration code N_CD may be set to a calibration code corresponding to 40 ohm which has a multiple relationship with 120 ohm. Therefore, based on the second calibration code N_CD, the pull-down termination circuit 420 may set various pull-down termination resistance values.

Based on the target resistance value information INF_TG, as described with reference to FIG. 3, the second calibration code N_CD provided to the resistance combination circuit 100 may be reset. For example, through a shifting operation, the second calibration code N_CD may be set to a calibration code corresponding to 480 ohm which has a multiple relationship with 120 ohm.

After the second calibration operation, the resistance combination circuit 100 may be enabled before the third calibration operation. Based on the second calibration code N_CD, the additional resistance value of the resistance combination circuit 100 may be set to 480 ohm. Therefore, the combined resistance value may be set to 96 ohm corresponding to the reference resistance value of 120 ohm and the additional resistance value of 480 ohm. Thus, through the third calibration operation, the first calibration code P_CD may be a calibration code corresponding to 96 ohm.

The first calibration code P_CD generated through the third calibration operation may be provided to the pull-up termination circuit 410. At this time, based on the resistance setting information INF_MRS, the first calibration code P_CD may be reset like the second calibration code N_CD. For example, the first calibration code P_CD may be set to a calibration code corresponding to 48 ohm which has a multiple relationship with 96 ohm, through a shifting operation. Furthermore, through an offset adjusting operation, the first calibration code P_CD may be set to a calibration code corresponding to 60 ohm. Therefore, based on the first calibration code P_CD, the pull-up termination circuit 410 may set various pull-up termination resistance values.

In accordance with an embodiment, the on-die termination circuit may set the combined resistance value using the additional resistance value. The on-die termination circuit may set various pull-up and pull-down termination resistance values through the combined resistance value.

Figure 5:
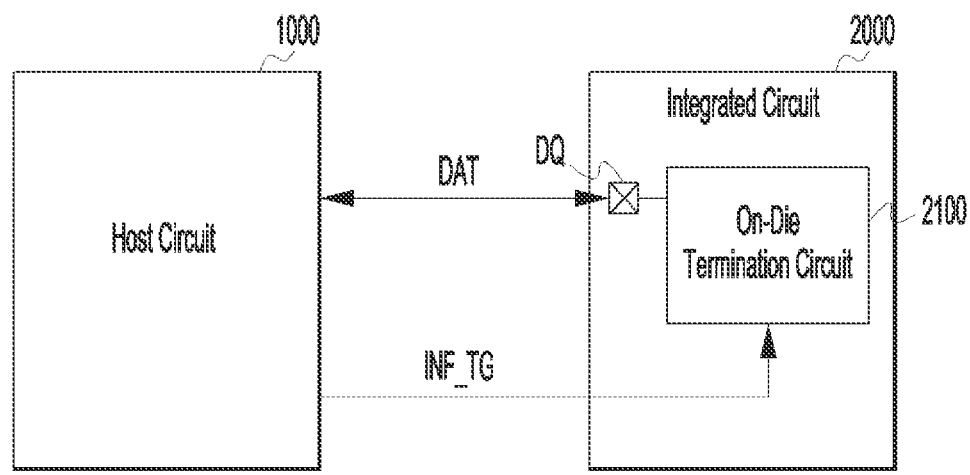
FIG. 5 is a block diagram illustrating a configuration of a semiconductor system in accordance with an embodiment.

FIG. 5 is a block diagram illustrating a configuration of a semiconductor system in accordance with an embodiment.

Referring to FIG. 5, the semiconductor system may include a host circuit 1000 and an integrated circuit 2000.

The host circuit 1000 may be configured to transmit/receive data DAT, and provide the target resistance value information INF_TG. The target resistance value information INF_TG may be information corresponding to a target resistance value for the additional resistance value formed by the resistance combination circuit 100 as described with reference to FIG. 3.

By combining the additional resistance value with the reference resistance value, the integrated circuit 2000 may include an on-die termination circuit 2100 which has an additional resistance value for setting a combined resistance value, and may reflect a termination resistance value, set according to a calibration sequence, into the input/output pad DQ. Since the on-die termination circuit 2100 has been already described with reference to FIGS. 1 to 4, the detailed descriptions of the configuration and operation thereof will be omitted herein.

The host circuit 1000 may transmit/receive data DAT to/from the integrated circuit 2000. Therefore, the host circuit 1000 and the integrated circuit 2000 need to perform an impedance matching operation. In accordance with an embodiment, The semiconductor system may include the on-die termination circuit 2100 for an impedance matching operation between the host circuit 1000 and the integrated circuit 2000. In particular, the on-die termination circuit 2100 may receive, from the host circuit 1000, the target resistance value INF_TG, and set the additional resistance value. Since, with reference to FIG. 3, the configuration and operation for setting the additional resistance value have been already described, the detailed descriptions thereof will be omitted herein.

In accordance with the embodiment, therefore, the semiconductor system may set various termination resistance values through the on-die termination circuit 2100 included in the integrated circuit 2000.

In accordance with the present embodiments, it is possible to secure more various impedance matching environments through the termination resistance value which is set according to the calibration sequence.

While various embodiments have been described above, it will be understood to those skilled in the art that the embodiments described are examples only. Accordingly, the on-die termination circuit, the operating method thereof and the semiconductor system, which have described herein, should not be limited based on the described embodiments.

What is claimed is:

1. An on-die termination circuit comprising:
   a resistance combination circuit having an additional resistance value for setting a combined resistance value by combining the additional resistance value with a reference resistance value, and configured to set the additional resistance value based on a second calibration code;
a first calibration circuit configured to generate a first calibration code corresponding to the reference resistance value or the combined resistance value according to a calibration sequence;
a second calibration circuit configured to generate the second calibration code corresponding to the first calibration code; and
a termination circuit coupled to an input/output pad, and configured to set a termination resistance value corresponding to the first and second calibration codes.

2. The on-die termination circuit according to claim 1, wherein whether to enable the resistance combination circuit is decided based on the calibration sequence.

3. The on-die termination circuit according to claim 1, wherein the first calibration circuit comprises:
a pull-up resistance adjusting circuit configured to adjust an internal resistance value based on the first calibration code;
a pull-up comparison circuit configured to generate a pull-up counting control signal by comparing a voltage, corresponding to the internal resistance value, the reference resistance value and the additional resistance value, to a pull-up reference voltage; and
a pull-up counting circuit configured to generate the first calibration code which is counted based on the pull-up counting control signal.

4. The on-die termination circuit according to claim 1, wherein the second calibration circuit comprises:
a pull-up variable resistance circuit configured to set a pull-up internal resistance value based on the first calibration code;
a pull-down resistance adjusting circuit configured to adjust a pull-down internal resistance value based on the second calibration code;
a pull-down comparison circuit configured to generate a pull-down counting control signal by comparing a voltage, corresponding to the pull-up internal resistance value and the pull-down internal resistance value, to a pull-down reference voltage; and
a pull-down counting circuit configured to generate the second calibration code which is counted based on the pull-down counting control signal.

5. The on-die termination circuit according to claim 1, wherein the termination circuit comprises:
a pull-up termination circuit configured to set a pull-up termination resistance value of the input/output pad based on the first calibration code; and
a pull-down termination circuit configured to set a pull-down termination resistance value of the input/output pad based on the second calibration code.

6. The on-die termination circuit according to claim 5, wherein each of the pull-up and pull-down termination circuits comprises:
a code control circuit configured to reset the corresponding calibration code based on resistance setting information; and
a resistance circuit configured to set the corresponding termination resistance value based on an output code of the code control circuit.

7. The on-die termination circuit according to claim 6, wherein the code control circuit performs one or more operations of an offset adjusting operation and a shifting operation on the corresponding calibration code.

8. The on-die termination circuit according to claim 1, wherein the resistance combination circuit comprises:
a code resetting circuit configured to reset the second calibration code based on target resistance value information; and
a variable resistance circuit configured to set the additional resistance value based on an output code of the code resetting circuit.

9. The on-die termination circuit according to claim 8, wherein the code resetting circuit performs one or more operations of an offset adjusting operation and a shifting operation on the second calibration code.

10. An operating method of an on-die termination circuit, comprising:
a first calibration operation step of generating a first calibration code through a calibration operation based on a reference resistance value;
a second calibration operation step of generating a second calibration code through a calibration operation based on the first calibration code;
a combined resistance value setting step of setting a combined resistance value by combining an additional resistance value with the reference resistance value; and
a third calibration operation step of generating a third calibration code through a calibration operation based on the combined resistance value; and
a termination resistance value setting step of setting a termination resistance value based on the second calibration code generated in the second calibration operation step and the third calibration code generated in the third calibration operation step.

11. The operating method according to claim 10, wherein the first calibration operation step comprises the steps of:
generating a pull-up counting control signal by comparing a voltage, into which the reference resistance value and an internal resistance value are reflected, to a preset pull-up reference voltage;
generating the first calibration code which is counted based on the pull-up counting control signal; and
adjusting the internal resistance value based on the first calibration code.

12. The operating method according to claim 10, wherein the second calibration operation step comprises the steps of:
setting a pull-up internal resistance value based on the first calibration code;
generating a pull-down counting control signal by comparing a voltage, into which the pull-up internal resistance value and a pull-down internal resistance value are reflected, to a preset pull-down reference voltage;
generating the second calibration code which is counted based on the pull-down counting control signal; and
adjusting the pull-down internal resistance value based on the second calibration code.

13. The operating method according to claim 10, wherein the third calibration operation step comprises the steps of:
generating a pull-up counting control signal by comparing a voltage, into which the combined resistance value and an internal resistance value are reflected, to a preset pull-up reference voltage;
generating the third calibration code which is counted based on the pull-up counting control signal; and
adjusting the internal resistance value based on the third calibration code.

14. The operating method according to claim 10, further comprising the step of resetting the second calibration code based on target resistance value information before the step of setting the combined resistance value.

15. The operating method according to claim 14, wherein the step of resetting the second calibration code comprises the step of performing one or more operations of an offset adjusting operation and a shifting operation on the second calibration code.

16. The operating method according to claim 10, further comprising the step of resetting the second and third calibration codes based on resistance setting information before the step of setting the termination resistance value.

17. The operating method according to claim 16, wherein the step of resetting the second and third calibration codes comprises the step of performing one or more operations of an offset adjusting operation and a shifting operation on each of the second and third calibration codes.

18. A semiconductor system comprising:
a host circuit configured to transmit/receive data and provide target resistance value information; and
an integrated circuit including an on-die termination circuit having an additional resistance value for setting a combined resistance value by combining the additional resistance value with a reference resistance value, and configured to reflect a termination resistance value, set according to a calibration sequence, into an input/output pad,
wherein the additional resistance value is adjusted based on the target resistance value information, and
wherein the on-die termination circuit comprises:
a resistance combination circuit configured to set the additional resistance value based on a second calibration code:
a first calibration circuit configured to generate a first calibration code corresponding to the reference resistance value or the combined resistance value according to the calibration sequence:
a second calibration circuit configured to generate the second calibration code corresponding to the first calibration code; and
a termination circuit coupled to the input/output pad, and configured to set the termination resistance value corresponding to the first and second calibration codes.

19. The semiconductor system according to claim 18, wherein whether to enable the resistance combination circuit is decided based on the calibration sequence.

20. The semiconductor system according to claim 18, wherein the resistance combination circuit comprises:
a code resetting circuit configured to reset the second calibration code based on the target resistance value information; and
a variable resistance circuit configured to set the additional resistance value based on an output code of the code resetting circuit.

* * * * *